United States Patent
Okada et al.

(10) Patent No.: US 10,068,814 B2
(45) Date of Patent: Sep. 4, 2018

(54) APPARATUS AND METHOD FOR EVALUATING SEMICONDUCTOR DEVICE COMPRISING THERMAL IMAGE PROCESSING

(71) Applicant: Mitsubishi Electric Corporation, Tokyo (JP)

(72) Inventors: Akira Okada, Tokyo (JP); Norihiro Takesako, Tokyo (JP); Hajime Akiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 49 days.

(21) Appl. No.: 15/136,448

(22) Filed: Apr. 22, 2016

(65) Prior Publication Data

US 2017/0092553 A1    Mar. 30, 2017

(30) Foreign Application Priority Data

Sep. 24, 2015 (JP) ................. 2015-186929

(51) Int. Cl.
| | |
|---|---|
| *G01R 31/00* | (2006.01) |
| *G01R 31/26* | (2014.01) |
| *H01L 21/66* | (2006.01) |
| *G01R 1/067* | (2006.01) |
| *H01L 21/326* | (2006.01) |

(52) U.S. Cl.
CPC .......... *H01L 22/32* (2013.01); *G01R 1/06755* (2013.01); *G01R 31/2601* (2013.01); *H01L 21/326* (2013.01); *H01L 22/14* (2013.01)

(58) Field of Classification Search
CPC ............ G01R 31/2601; G01R 31/2891; G01R 31/2863
See application file for complete search history.

(56) References Cited

U.S. PATENT DOCUMENTS

| | | | |
|---|---|---|---|
| 6,043,671 A | 3/2000 | Mizuta | |
| 6,765,401 B2 * | 7/2004 | Hamada | ............ G01R 1/07314 324/750.1 |

(Continued)

FOREIGN PATENT DOCUMENTS

| | | |
|---|---|---|
| JP | Hei11-145215 | 5/1999 |
| JP | 2001-189353 A | 7/2001 |

(Continued)

*Primary Examiner* — Minh N Tang
(74) *Attorney, Agent, or Firm* — Studebaker & Brackett PC

(57) ABSTRACT

An apparatus for evaluating a semiconductor device includes: a chuck stage for fixing a semiconductor device; an insulating substrate; a plurality of probes fixed to the insulating substrate; a temperature adjustment unit adjusting temperatures of the plurality of probes; an evaluation/control unit causing a current to flow into the semiconductor device through the plurality of probes to evaluate an electric characteristic of the semiconductor device; an inspection plate having a front surface and a rear surface opposite to each other; a thermal image measurement unit acquiring a thermal image of the inspection plate when distal end portions of the plurality of probes are pressed against the front surface; and a thermal image processing unit performing image processing to the thermal image to obtain in-plane positions and temperatures of the distal end portions of the plurality of probes.

15 Claims, 4 Drawing Sheets

(56) References Cited

U.S. PATENT DOCUMENTS

| | | | |
|---|---|---|---|
| 7,772,862 B2 * | 8/2010 | Yamada | G01R 31/2891 324/754.01 |
| 2009/0212804 A1 | 8/2009 | Yamada et al. | |
| 2013/0278279 A1 * | 10/2013 | Ishii | G01R 31/2863 324/750.03 |
| 2013/0285684 A1 * | 10/2013 | Okada | G01R 31/2601 324/750.03 |

FOREIGN PATENT DOCUMENTS

| | | |
|---|---|---|
| JP | 2002-196017 A | 7/2002 |
| JP | 2005-079253 A | 3/2005 |
| JP | 2005-189126 A | 7/2005 |
| JP | 2009-198407 A | 9/2009 |
| JP | 2012-023120 A | 2/2012 |
| JP | 2012-047503 A | 3/2012 |

* cited by examiner

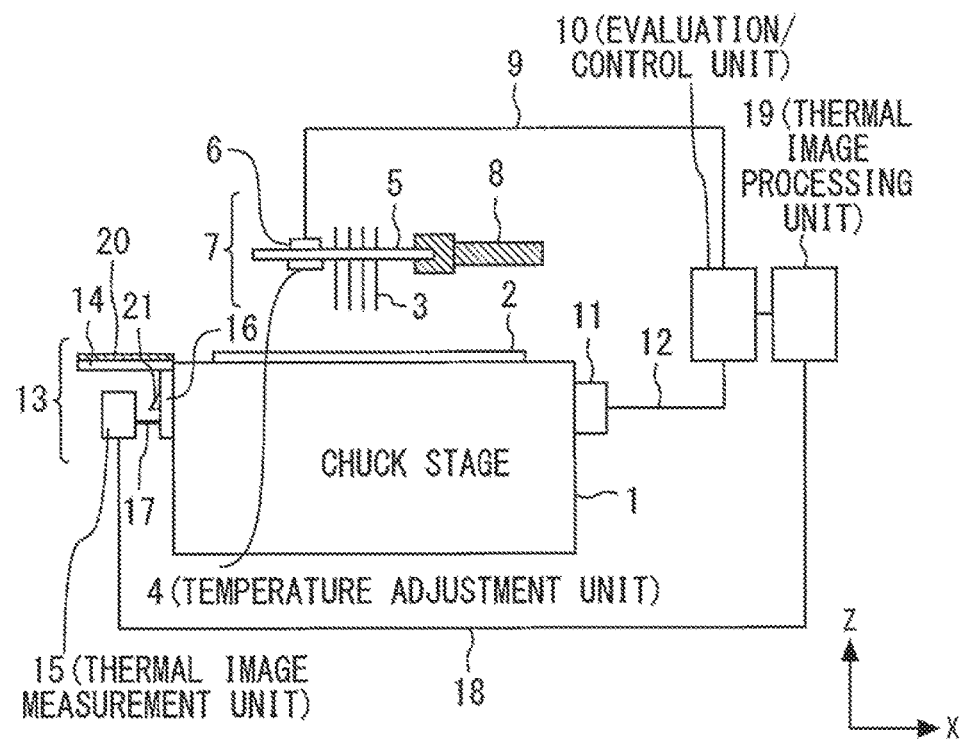
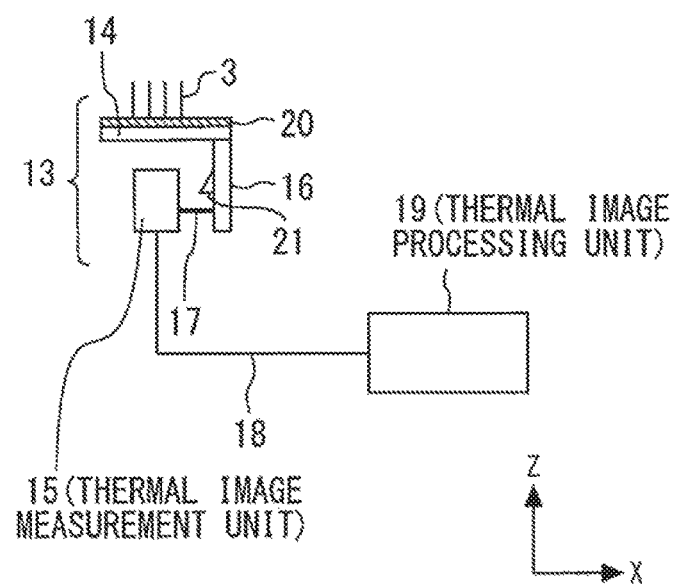

FIG. 7
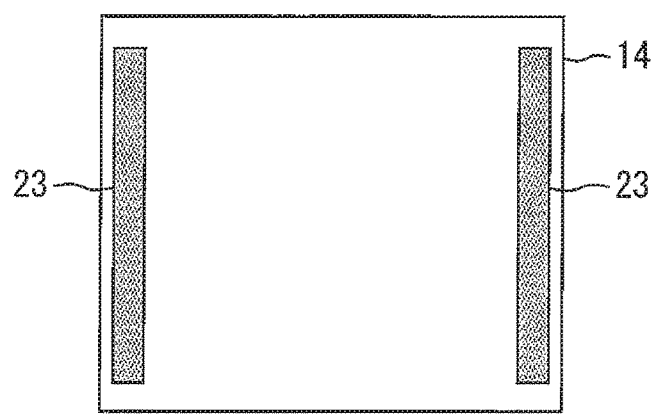
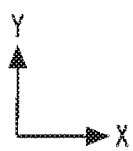
FIG. 8
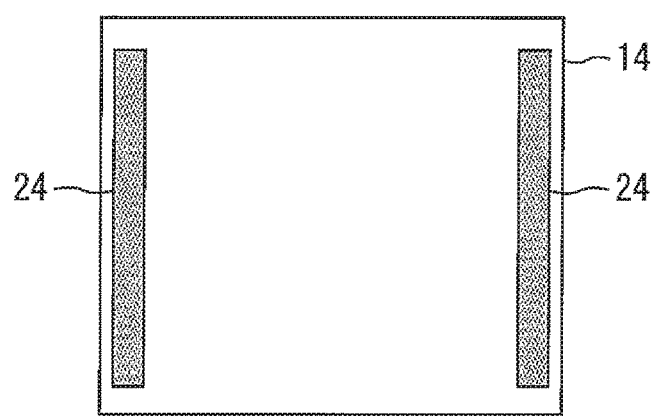
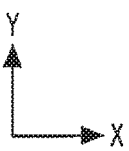

APPARATUS AND METHOD FOR EVALUATING SEMICONDUCTOR DEVICE COMPRISING THERMAL IMAGE PROCESSING

BACKGROUND OF THE INVENTION

Field

The present invention relates to an apparatus and method for evaluating a semiconductor device which can easily accurately inspect the in-plane positions and temperatures of the distal end portions of a plurality of probes.

Description of the Related Art

Background

In a semiconductor wafer or chips obtained by cutting a semiconductor wafer into pieces, the electric characteristics of each semiconductor device serving as an object to be measured is evaluated. In this case, after an installation surface of the object to be measured is brought into contact with a surface of a chuck stage and fixed thereto by vacuum suction or the like, a probe to perform an electric input/output operation is brought into contact with an electrode formed on a part of a non-installation surface of the object to be measured. In inspection of a semiconductor device having a vertical structure which causes a large current to the device in a vertical direction (out-of-plane direction), a chuck stage serves as an electrode. From the past, the number of pins of a probe is increased to meet a request of application of a large current and a high voltage.

In evaluation of the electric characteristics of a semiconductor device, accurate contact of a plurality of probes to an electrodes formed on a surface of a semiconductor device is important. Misalignment of the distal end portion of a probe to be in contact with an electrode may prevent a desired current or voltage from being applied to a semiconductor device. In addition to this, contact of the probe to a portion except for the electrode may break the semiconductor device.

A short probe is desired to suppress the distal end portion of the probe from being misaligned. However, in order to suppress a discharge phenomenon, the probe tends to be elongated, and a distance between the main body of a probe guard and a semiconductor device tends to be increased. Thus, the distal end portion of the probe may be easily misaligned.

Under these circumstances, as a probe position measurement method, a contact-free method is known. For example, image processing measurement performed by a camera installed to face a probe is known. However, when the position of the distal end portion of a probe is to be measured, a plurality of disturbance factors such as a background or a distance, focusing on respective targets, and influences of attachments make it difficult to achieve accurate measurement.

For recent diversification of environments in which semiconductor devices are used, evaluation of electric characteristics in a wide temperature range from a low temperature to a high temperature is necessary. When a chuck stage located on the semiconductor device side is set at a low or high temperature, a temperature difference occurring between the chuck stage and a probe or a probe guard side causes thermal expansion or thermal contraction of the probe guard, and the distal end portion of the probe being in contact with the semiconductor device disadvantageously misaligned. Furthermore, when the probe is brought into contact with the semiconductor device while the temperature difference is kept, the temperature of the device is different from a set temperature to disadvantageously deteriorate the accuracy of the evaluation.

Methods of inspecting a probe position include a method which observes the position and size of a probe mark such that a probe is brought into contact with a deformable body and then separated from the deformable body (for example, see Japanese Unexamined Patent Publication No. 2001-189353) and a method of eliminating a needle mark of a needle mark transferring member (for example, see Japanese Unexamined Patent Publication No. 2009-198407) are disclosed. As a method of evaluating a semiconductor device when the temperature of the semiconductor device is variable, a method in which a heating sheet on which a resistor is disposed is installed on a probe card to heat a probe circuit board is disclosed (for example, Japanese Unexamined Patent Publication No. 2012-47503). A method in which a halogen lamp is caused to face a probe circuit board and to irradiate light on the probe circuit board when a chuck is retreated so as to heat the probe circuit board (for example, see Japanese Unexamined Patent Publication No. 2012-23120) is also disclosed. A method in which a ceramics heater disposed on a printed circuit board configuring a probe card heats a probe circuit board is also disclosed (for example, see Japanese Unexamined Patent Publication No. 2002-196017).

However, probe inspection according to Japanese Unexamined Patent Publication No. 2001-189353 requires a reproducing process for a deformable body in every probe inspection. In addition, observation after transferring disadvantageously requires a long inspection time. The probe inspection is hard to be added to a conventional evaluation apparatus. Also in the needle mark transferring member in Japanese Unexamined Patent Publication No. 2009-198407, although it is described that the mark is recovered within a short period of time, a reproducing process is still required. Furthermore, observation after transferring disadvantageously requires a long inspection time.

Any of the Patent Documents does not describe temperature detection of the distal end portion of a probe being in contact with a semiconductor device. Since measurement by a temperature sensor installed in each apparatus targets the temperature of a probe circuit board, a temperature difference between the probe and the semiconductor device is unknown, and deterioration in evaluation accuracy caused by the temperature difference poses a problem.

Only expansion and contraction of a probe circuit board are problematically handled in terms of the in-plane position of the distal end portion of a probe being in contact with a semiconductor device. An initial positional defect of the probe occurring when a probe is installed on a probe circuit board and misalignment at a variable temperature cannot be checked immediately before evaluation of a semiconductor device.

SUMMARY

The present invention has been made to solve the above problems, and has as its object to obtain an apparatus and method for evaluating a semiconductor device which can easily accurately inspect the in-plane positions and temperatures of distal end portions of a plurality of probes.

According to the present invention, an apparatus for evaluating a semiconductor device includes: a chuck stage for fixing a semiconductor device; an insulating substrate; a plurality of probes fixed to the insulating substrate; a temperature adjustment unit adjusting temperatures of the plurality of probes; an evaluation/control unit causing a current to flow into the semiconductor device through the plurality of probes to evaluate an electric characteristic of the semiconductor device; an inspection plate having a front surface and a rear surface opposite to each other; a thermal image measurement unit acquiring a thermal image of the inspection plate when distal end portions of the plurality of probes are pressed against the front surface; and a thermal image processing unit performing image processing to the thermal image to obtain in-plane positions and temperatures of the distal end portions of the plurality of probes.

In the present invention, a thermal image of the inspection plate against which the distal end portions of the plurality of probes are pressed are acquired, and image processing is performed to the thermal image to inspect the in-plane positions and the temperatures of the distal end portions of the plurality of probes. Therefore, the in-plane positions and the temperatures of the distal end portions of the plurality of probes can be easily accurately inspected.

Other and further objects, features and advantages of the invention will appear more fully from the following description.

BRIEF DESCRIPTION OF DRAWINGS

FIG. 1 is a schematic view showing an apparatus for evaluating a semiconductor device according to Embodiment 1 of the present invention.

FIG. 2 is a schematic block diagram of a probe position/temperature inspection apparatus according to the Embodiment 1 of the present invention in a probe contact state.

FIG. 7 is a bottom view showing an inspection substrate according to the Embodiment 2 of the present invention.

FIG. 8 is a bottom view showing a modification of the inspection substrate according to the Embodiment 2 of the present invention.

DESCRIPTION OF EMBODIMENTS

Figure 3:
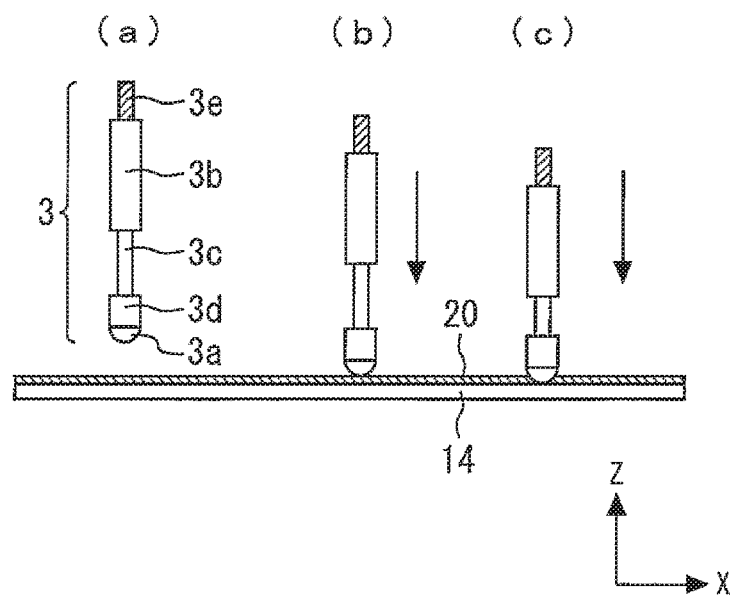
FIG. 3 is a side view for explaining an operation of the probe.

An apparatus and method for evaluating a semiconductor device according to the embodiments of the present invention will be described with reference to the drawings. The same components will be denoted by the same symbols, and the repeated description thereof may be omitted.

Embodiment 1

FIG. 1 is a schematic view showing an apparatus for evaluating a semiconductor device according to Embodiment 1 of the present invention. A chuck stage 1 fixes a semiconductor device 2 serving as an object to be evaluated thereon. The chuck stage 1 is a pedestal which is brought into contact with an installation surface (rear surface) of the semiconductor device 2 to fix the semiconductor device 2. A means for fixing the semiconductor device 2 is, for example, vacuum suction. However, the vacuum suction need not always be used, and electrostatic adsorption or the like may be used.

The semiconductor device 2 is a semiconductor wafer on which a plurality of semiconductor chips are formed or a semiconductor chip itself. In this embodiment, the semiconductor device 2 has a vertical structure in which a large current is caused to flow in a vertical direction (out-of-plane direction) of the device. However, the semiconductor device 2 need not always have the vertical structure, and may be a semiconductor device having a lateral structure in which an input/output operation is performed on one surface of the semiconductor device.

A plurality of probes 3 and a temperature adjustment unit 4 are fixed to an insulating substrate 5. The plurality of probes 3 and the temperature adjustment unit 4 are connected to a connection unit 6 by a wire (not shown) such as a metal plate formed on the insulating substrate 5. The plurality of probes 3, the temperature adjustment unit 4, the insulating substrate 5, the connection unit 6, and the wire (not shown) constitute a probe base unit 7. The probe base unit 7 can be moved in an arbitrary direction by a moving arm 8. The probe base unit 7 is configured to be held by one moving arm 8 here. However, the configuration need not always be used, and the probe base unit 7 may be stably held by a plurality of moving arms. In addition, the probe base unit 7 need not always be moved, and the chuck stage 1 and the semiconductor device 2 may be moved.

In evaluation of the semiconductor device 2 having the vertical structure, the plurality of probes 3 are electrically connected to front-surface electrodes disposed on a front surface of the semiconductor device 2, and the chuck stage 1 is electrically connected to a rear-surface electrode disposed on a rear surface of the semiconductor device 2.

The temperature adjustment unit 4 adjusts the temperatures of the plurality of probes 3. The temperature adjustment unit 4, for example, as described in Japanese Unexamined Patent Publication No. 2013-229496, has an electrically heated wire winded on the probes 3 or a socket in which the probes 3 are disposed and a control unit for the electrically heated wire. However, this configuration need not be always used, and the temperature adjustment unit 4 may have another configuration.

The connection unit 6 of the insulating substrate 5 is connected to an evaluation/control unit 10 through a signal line 9. A surface of the chuck stage 1 is connected to the evaluation/control unit 10 through a connection unit 11 disposed on a side surface of the chuck stage 1 and a signal line 12. The evaluation/control unit 10 causes a current to flow into the semiconductor device 2 through the plurality of probes 3 to evaluate the electric characteristics of the semiconductor device 2.

The number of probes 3 for evaluation is set to two or more on the assumption that a large current (for example, 5 A or more) is applied. In order to make current densities applied to the probes 3 equal to each other, distances between the connection unit 6 of the insulating substrate 5 and the connection unit 11 of the chuck stage 1 through the probes 3 are desired to be equal to each other. Thus, the connection unit 6 and the connection unit 11 are desired to be disposed at positions facing each other through the probes 3.

FIG. 2 is a schematic block diagram of a probe position/temperature inspection apparatus according to the Embodiment 1 of the present invention in a probe contact state. A probe position/temperature inspection apparatus 13 mainly includes an inspection plate 14, a thermal image measurement unit 15, and a base unit 16 supporting these components.

The inspection plate 14 is made of a material having heat conductivity. Since the probe 3 is repeatedly pressed against the inspection plate 14 every inspection, the inspection plate 14 is desirably made of a material having certain strength to avoid the inspection plate from being broken. For example, the inspection plate 14 is constituted by a plate having a thickness of several millimeters and made of a metal material.

The thermal image measuring unit 15 is fixed to the base unit 16 through a fixing arm 17, and connected to a thermal image processing unit 19 through a signal line 18. A protecting member 20 is disposed on an front surface of the inspection plate 14 against which the distal end portions of the probes 3 are pressed. The protecting member 20 has a hardness lower than that of the distal end portion of the probe 3. The protecting member 20 is desirably a sheet material which has flexibility and can be easily replaced, for example, a PVC sheet. However, the protecting member 20 is not limited to the sheet.

The thermal image measurement unit 15 is a camera which acquires a thermal image of the inspection plate 14 having a surface against which the distal end portions of the plurality of probes 3 are pressed, and also a thermography. More specifically, the thermal images of the distal end portions of the plurality of probes 3 are indirectly acquired through the inspection plate 14. At this time, since infrared rays are used to make it possible to exclude disturbance factors caused by visible light, inspection accuracy can be easily improved.

The thermal image processing unit 19 performs image processing (image recognition) to a thermal image to obtain the in-plane positions and temperatures of the distal end portions of the plurality of probes 3. As a cooler for cooling the inspection plate 14, a blower 21 which sends air toward the inspection plate 14 is disposed on a wall surface of the base unit 16.

FIG. 3 is a side view for explaining an operation of the probe. The probe 3 includes a distal end portion 3a which is in mechanical and electric contact with a surface electrode of the semiconductor device 2, a barrel-like portion 3b serving as a base fixed to the insulating substrate 5, a plunger 3d including a press-in portion 3c which can be slid through a spring member such as a spring built in the probe 3 when the probe 3 is in contact with the electrode, and an electrically connecting portion 3e electrically connected to the plunger 3d and serving as an external output terminal. The probe 3 is made of a material having conductivity, for example, a metal material such as copper, tungsten, or rhenium-tungsten. The material of the probe 3 is not limited to these metal materials. In particular, in terms of improvement of conductivity, improvement of durability, or the like, the distal end portion 3a may be covered with another member made of, for example, gold, palladium, tantalum, or platinum.

In an initial state in FIG. 3(a), when the probe 3 is moved downward along a Z axis toward the protecting member 20 disposed on the front surface of the inspection plate 14, first, the protecting member 20 and the distal end portion 3a are brought into contact with each other as shown in FIG. 3(b). When the probe 3 is further moved downward, as shown in FIG. 3(c), the press-in portion 3c is pressed into the burrel-like portion 3b through the spring member to make it sure to be in contact with the protecting member 20 disposed on the front surface of the inspection plate 14.

In this case, the probe 3 incorporates the spring member having a sliding property in the Z-axis direction. However, this configuration need not always be used, the probe 3 may include a spring member disposed outside the probe 3. The probe 3 is of a spring type in terms of suppression of electric discharge. However, the spring type need not always be used, and a probe of a cantilever type, a laminated probe, a wire probe, or the like may be used.

Figure 4:
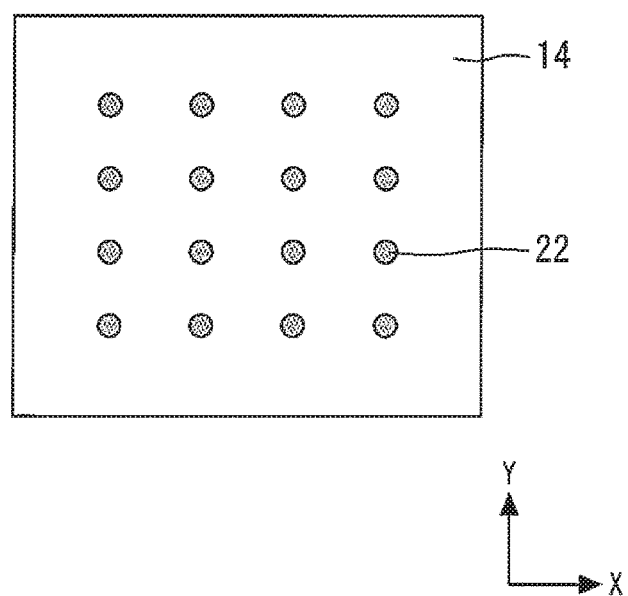
FIG. 4 is a diagram showing a thermal image of an inspection plate against which 16 probes placed at normal positions are pressed.
Figure 5:
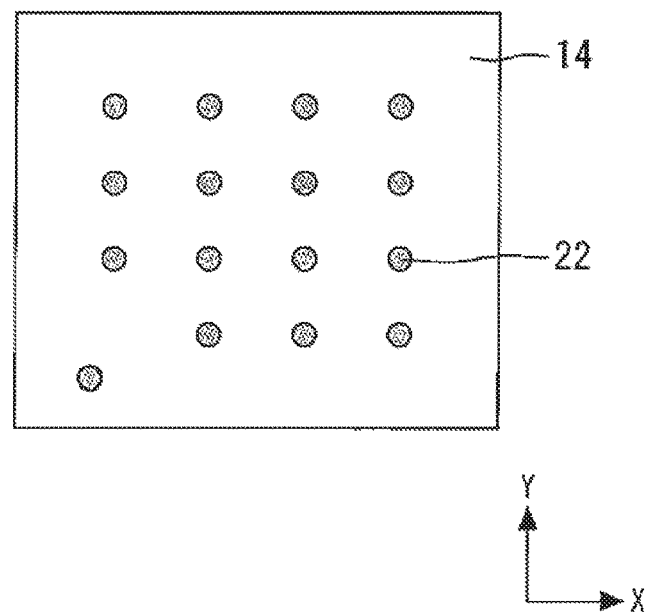
FIG. 5 is a diagram showing a thermal image of an inspection plate against which probes being at abnormal positions are pressed.

FIG. 4 is a diagram showing a thermal image of an inspection plate against which 16 probes placed at normal positions are pressed. When the distal end portions 3a of the probes 3 heated to a high temperature are pressed against the inspection plate 14, only the portions against which the distal end portions 3a are pressed increase in temperature, and the front surface of the inspection plate 14 has an uneven temperature distribution. For this reason, the portions against which the probes 3 are pressed are photographed as a probe thermal image 22. FIG. 5 is a diagram showing a thermal image of an inspection plate against which probes being at abnormal positions are pressed. A defect occurs at a probe position on the lower left in FIG. 5. When the defect at the probe position is detected, an alarm is transmitted from the thermal image processing unit 19 to the evaluation/control unit 10, a subsequent evaluation process is intermitted, and the probe 3 is checked.

Sequentially, an operation procedure of the evaluation apparatus for a semiconductor device according to the embodiment. The semiconductor device 2 is fixed to the chuck stage 1 such that the installation surface of the semiconductor device 2 is brought into contact with the chuck stage 1. The temperature of the semiconductor device 2 is increased to an evaluation temperature by using a heater disposed on the chuck stage 1. The plurality of probes 3 are heated with the temperature adjustment unit 4 to increase the temperature of the probes 3 to the evaluation temperature. The plurality of heated probes 3 are moved onto the inspection plate 14 and pressed against the front surface of the inspection plate 14 with the same load as that in the evaluation. In this state, a thermal image of the inspection plate 14 is acquired by the thermal image measurement unit 15. The thermal image processing unit 19 performs image processing to the thermal image to obtain the in-plane positions and the temperatures of the distal end portions of the plurality of probes 3. In this manner, before the electric evaluation of the semiconductor device 2, the positions and the temperatures of the distal end portions of the plurality of probes 3 are inspected.

When the in-plane positions or the temperatures of the distal end portions of the plurality of probes 3 are abnormal, the evaluation process is intermitted without evaluating electric characteristics, and the probes 3 are inspected. When the in-plane positions or the temperatures are normal, the plurality of probes 3 are moved onto the semiconductor device 2 to bring the distal end portions of the plurality of probes 3 into contact with the electrodes of the semiconductor device 2, and the evaluation/control unit 10 causes a current into the semiconductor device 2 through the plurality of probes 3 to evaluate the electric characteristics of the semiconductor device 2.

The probe positions and the probe temperatures are inspected, and the distal end portions of the plurality of heated probes 3 are separated from the inspection plate 14. Thereafter, the blower 21 sends air to the inspection plate 14 to cool the inspection plate 14. The probe positions and the probe temperatures are inspected in units of semiconductor devices to be evaluated or at a predetermined scheduled frequency.

As described above, in the embodiment, a thermal image of the inspection plate 14 against which the distal end portions of the plurality of probes 3 are pressed are acquired, and image processing is performed to the thermal image to inspect the in-plane positions and the temperatures of the distal end portions of the plurality of probes 3. In this case, the semiconductor device 2 is evaluated in a state in which the plurality of probes 3 are pressed against the surface electrodes disposed on the surface of the semiconductor device 2. Thus, since the probe positions/temperatures are inspected in a state in which the distal end portions of the plurality of probes 3 are pressed against the front surface of the inspection plate 14 to make it possible to approximately inspect the probe positions/temperatures in the evaluation of the electric characteristics of the semiconductor device 2, the positions of the distal end portions of the plurality of probes 3 in the evaluation of the semiconductor device 2 can be known. A fluctuation of heights of the distal end portions of the plurality of probes 3 is negligible. Since a probe mark is unused, a deformable body and a needle mark transferring member are not required, and the inspection can be performed while disturbance factors are suppressed. Furthermore, the temperatures of the distal end portions of the probes 3 can also be simultaneously inspected. As a result, the in-plane positions and the temperatures of the distal end portions of the plurality of probes 3 can be easily accurately inspected. In addition, the accuracy of evaluation of the semiconductor device performed after the inspection is also improved. Although the probe position/temperature inspection apparatus 13 can also be independently used, since the probe position/temperature inspection apparatus 13 can be easily added to a conventional evaluation apparatus, a conventional evaluation apparatus for a semiconductor device can be directly used.

The thermal image measurement unit 15 is disposed on the rear surface side of the inspection plate 14. In this manner, since a state in which the distal end portions of the plurality of probes 3 are pressed against the front surface can be inspected in real time, accurate inspection can be achieved.

The temperature of the inspection plate 14 with which the heated probes 3 are brought into contact does not return to normal temperature immediately after the probes 3 are separated from the inspection plate 14. Since an error may occur due to a thermal history when the next inspection is performed without change, inspection accuracy is deteriorated. Thus, inspection is performed, and the blower 21 forcibly cools the inspection plate 14 after the heated probes 3 are separated. In this manner, the accuracy of the next inspection can be maintained without being influenced by the previous inspection. Since the inspection plate 14 is cooled in advance, even in measurement performed at normal temperature without heating the probes 3, the probe positions can be inspected. This configuration need not always be used, and an aluminum member (heat sink) including heat-radiation fins may be disposed on the inspection plate 14 as a cooler. The member need not always be set, and may be configured to be brought into contact with the inspection plate 14 only after the probes 3 are separated from the inspection plate 14. The blower 21 and the heat-radiation fins can be easily installed at low cost.

The protecting member 20 protects the front surface of the inspection plate 14 against which the distal end portions of the probes 3 are pressed every inspection to make it possible to protect the distal end portions of the probes 3. When the protecting member 20 is damaged, only the protecting member 20 need only be replaced, and the inspection plate 14 need not be replaced.

Since the inspection plate 14 is made of a high-strength metal material, the inspection plate 14 is hard to be broken even though the probes 3 are repeatedly brought into contact with the inspection plate 14, and the inspection plate 14 need not be replaced to contribute a reduction in cost. Furthermore, since the inspection plate 14 is excellent in heat conductivity, rapid measurement can be achieved. However, the inspection plate 14 need not always be made of the metal material, and the inspection plate 14 may be made of a ceramics material. As long as a high-strength ceramics material is used, the inspection plate 14 is hard to be broken even though the probes 3 are repeatedly brought into contact with the inspection plate 14, and the inspection plate 14 need not be replaced to achieve a low cost. Ceramics which are excellent in thermal conductivity are selected to make it possible to achieve rapid measurement.

The inspection plate 14 may be made of a thermal anisotropic material having thermal anisotropy in which a thermal conductivity direction is regulated to the Z direction. Since heat can be suppressed from spreading in the plane of the inspection plate 14, the positions of the distal end portions of the probes 3 can be accurately measured. As the thermal anisotropic material, for example, COMPOROID (product available from Thermo Graphics Co., Ltd.) is known. However, the thermal anisotropic material is not limited to the product.

The inspection plate 14 and the base unit 16 are integrally configured with the same material to make it possible to reduce the cost, and the apparatus can be easily installed on a side surface of the chuck stage 1. When a metal material is selected as the material, the apparatus can be fabricated by bending.

The thermal image processing unit 19 and the probe position/temperature inspection apparatus 13 are achieved by a processing circuit such as a CPU or a system LSI which executes a program stored in a memory. A plurality of processing circuits may execute the functions in cooperation with each other.

Embodiment 2

Figure 6:
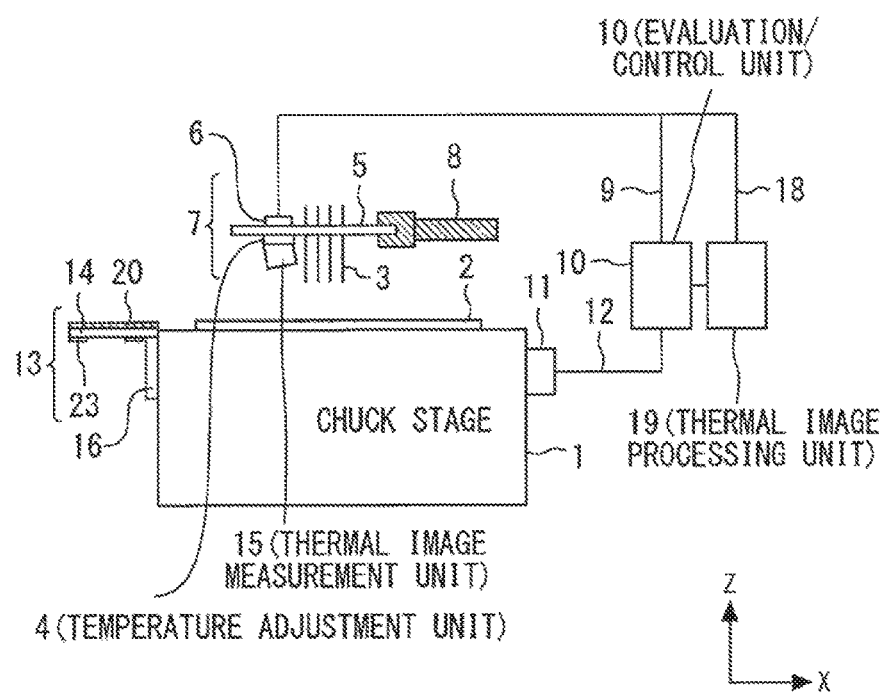
FIG. 6 is a schematic view showing an evaluation apparatus for a semiconductor device according to Embodiment 2 of the present invention.

FIG. 6 is a schematic view showing an evaluation apparatus for a semiconductor device according to Embodiment 2 of the present invention. FIG. 7 is a bottom view showing an inspection substrate according to the Embodiment 2 of the present invention.

The inspection plate 14 is the same member as that in the Embodiment 1, and peltiert elements 23 are disposed on both sides of the inspection plate 14 as coolers for cooling the inspection plate 14. The apparatus can be reduced in size by using the peltiert elements.

The thermal image measurement unit 15 is disposed on an insulating substrate 5. Although a state in which the distal end portions of the probes 3 are pressed against the front surface of the inspection plate 14 is difficult to be measured because of interruption by the probes 3, measurement is performed after the probes 3 are separated. Although the inspection is impossible in real time, wires 9 and 18 are gathered near the insulating substrate 5 to make it possible to reduce the entire apparatus in size.

In inspection of the heated probes 3, the peltiert elements 23 are used to cool the inspection plate 14 after the inspection. On the other hand, in inspection of the unheated probes 3 at normal temperature, the peltiert elements 23 are used to cool the inspection plate 14 before the inspection. When the probes 3 at normal temperature are brought into contact with the cooled inspection plate 14 before the inspection, the temperature of a contact portion increases, and a temperature distribution on the front surface of the inspection plate 14 becomes uneven. In this case, the temperatures of the distal end portions of the probes 3 do not pose a problem, and the positions of the probes 3 are detected on the basis of the uneven temperature distribution.

According to the embodiment, as in the Embodiment 1, the in-plane positions and the temperatures of the distal end portions of the plurality of probes 3 can be easily accurately inspected before the evaluation of the semiconductor device. Not only when the probes 3 are heated or cooled but also when evaluation is performed at normal temperature, the same advantage as described above can be obtained.

FIG. 8 is a bottom view showing a modification of the inspection substrate according to the Embodiment 2 of the present invention. In place of the peltiert elements 23, heaters 24 for heating the inspection plate 14 are disposed on both the sides of the inspection plate 14. The inspection plate 14 is heated in advance of the inspection to make it possible to inspect the probes 3 at normal temperature by the same manner as described above.

As long as the peltiert elements 23 and the heaters 24 do not block a thermal image from being acquired by the thermal image measurement unit 15, the peltiert elements 23 and the heaters 24 may be installed on either the front surface or the rear surface of the inspection plate 14. The installation positions of the peltiert elements and the heaters are not limited to both the sides, and the peltiert elements 23 and the heaters 24 may be installed to surround a thermal image acquiring portion. When the numbers of peltiert elements and heaters are increased to make it possible to shorten a heating time or a cooling time.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-186929, filed on Sep. 24, 2015 including specification, claims, drawings and summary, on which the Convention priority of the present application is based, is incorporated herein by reference in its entirety.

The invention claimed is:

1. An apparatus for evaluating a semiconductor device comprising:
a chuck stage for fixing a semiconductor device;
an insulating substrate;
a plurality of probes fixed to the insulating substrate;
a temperature adjustment unit adjusting temperatures of the plurality of probes;
an evaluation/control unit causing a current to flow into the semiconductor device through the plurality of probes to evaluate an electric characteristic of the semiconductor device;
an inspection plate having a front surface and a rear surface opposite to each other;
a thermal image measurement unit either disposed under a rear surface of the inspection plate or attached to the insulating substrate, the thermal image measurement unit acquiring a thermal image of the inspection plate when distal end portions of the plurality of probes are pressed against the front surface; and
a thermal image processing unit performing image processing to the thermal image to obtain in-plane positions and temperatures of the distal end portions of the plurality of probes.

2. The apparatus for evaluating a semiconductor device of claim 1, wherein the thermal image measurement unit is disposed on the rear surface side of the inspection plate.

3. The apparatus for evaluating a semiconductor device of claim 1, wherein the thermal image measurement unit is disposed on the insulating substrate.

4. The apparatus for evaluating a semiconductor device of claim 1, further comprising a cooler cooling the inspection plate.

5. The apparatus for evaluating a semiconductor device of claim 4, wherein the cooler includes a blower sending air toward the inspection plate.

6. The apparatus for evaluating a semiconductor device of claim 4, wherein the cooler includes a heat-radiation fin disposed on the inspection plate.

7. The apparatus for evaluating a semiconductor device of claim 4, wherein the cooler includes a peltier element disposed on the inspection plate.

8. The apparatus for evaluating a semiconductor device of claim 1, further comprising a heater heating the inspection plate.

9. The apparatus for evaluating a semiconductor device of claim 1, further comprising a protecting member disposed on the front surface of the inspection plate and having a hardness lower than that of the distal end portions of the plurality of probes.

10. The apparatus for evaluating a semiconductor device of claim 1, wherein the inspection plate is made of a metal material.

11. The apparatus for evaluating a semiconductor device of claim 1, wherein the inspection plate is made of a ceramic material.

12. The apparatus for evaluating a semiconductor device of claim 1, wherein the inspection plate is made of a thermal anisotropic material.

13. The apparatus for evaluating a semiconductor device of claim 10, further comprising a base unit supporting the inspection plate,
wherein the inspection plate and the base unit are integrally configured with same material.

14. A method for evaluating a semiconductor device comprising:
heating a plurality of probes fixed to an insulating substrate by a temperature adjustment unit;
pressing distal end portions of the plurality of heated probes against a front surface of an inspection plate and acquiring a thermal image of the inspection plate by a thermal image measurement unit that is either disposed under a rear surface of the inspection plate or attached to the insulating substrate;
performing image processing to the thermal image to obtain in-plane positions and temperatures of the distal end portions of the plurality of probes by a thermal image processing unit; and
when the in-plane positions or the temperatures of the plurality of probes are normal, bringing the distal end portions of the plurality of probes into contact with electrodes of a semiconductor device and causing a current to flow into the semiconductor device through the plurality of probes by an evaluation/control unit to evaluate an electric characteristic of the semiconductor device.

15. The method for evaluating a semiconductor device of claim 14, further comprising, after separating the distal end portions of the plurality of heated probes from the inspection plate, cooling the inspection plate by a cooler.

* * * * *